United States Patent
Rosik et al.

(10) Patent No.: US 7,902,903 B2
(45) Date of Patent: Mar. 8, 2011

(54) PROGRAMMABLE EFUSE AND SENSE CIRCUIT

(75) Inventors: Nick Rosik, Torrance, CA (US); Richard D Young, Lawndale, CA (US); Mark E Stading, Hermosa Beach, CA (US); Denpol Thammanukultorn, Chino Hills, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 12/502,938

(22) Filed: Jul. 14, 2009

(65) Prior Publication Data

US 2011/0012668 A1    Jan. 20, 2011

(51) Int. Cl.
*G11C 17/16*    (2006.01)
(52) U.S. Cl. .......................................... 327/525; 365/96
(58) Field of Classification Search .................. None
See application file for complete search history.

(56) References Cited

U.S. PATENT DOCUMENTS

| | | | |
|---|---|---|---|
| 7,009,443 B2* | 3/2006 | Illegems | 327/525 |
| 7,098,721 B2 | 8/2006 | Ouellette et al. | |
| 7,403,061 B2* | 7/2008 | Barwin et al. | 327/525 |
| 7,501,879 B1* | 3/2009 | Oh et al. | 327/525 |
| 7,742,352 B1* | 6/2010 | Hara et al. | 365/210.1 |
| 2006/0044049 A1 | 3/2006 | Ouellette et al. | |
| 2006/0083040 A1 | 4/2006 | Pham et al. | |
| 2009/0153228 A1 | 6/2009 | Barwin et al. | |

OTHER PUBLICATIONS

R. F. Rizzolo, et al., "IBM System z9 eFUSE applications and methodology", IBM J. Res. & Dev., vol. 51, No. 1/2 Jan./Mar. 2007 (pp. 65-75).

Extended European Search Report for corresponding European application No. 10251238.1, Extended European Search Report dated Sep. 13, 2010 and mailed Sep. 27, 2010 (6 pgs.).

* cited by examiner

*Primary Examiner* — Lincoln Donovan
*Assistant Examiner* — Terry L Englund
(74) *Attorney, Agent, or Firm* — Christie, Parker & Hale, LLP

(57) ABSTRACT

A circuit for electric fuses includes circuits for sensing status and programming that have separate paths for each operation. The circuit includes a plurality of electrically programmable fuses and, associated with each fuse, a switch for coupling a first terminal of the fuse to a ground supply for programming or to a comparator for sensing. The circuit uses a switched current source to supply current to the fuses for programming. The comparator senses a fuse status when a current source is switched through the fuse. The comparator compares a voltage across the fuse and associated switches to a comparison voltage across a comparison resistor and switches included for matching.

6 Claims, 2 Drawing Sheets

PROGRAMMABLE EFUSE AND SENSE CIRCUIT

BACKGROUND OF THE INVENTION

The present invention relates generally to integrated circuit fuses and more particularly to circuits for programming and sensing the state of electrically programmable fuses.

Integrated circuits may often advantageously use permanent storage for holding information such as chip identification, redundancy placement, and calibration for trimming resistors, capacitors, other analog circuit components. Permanent storage that is reliable and economical is desirable.

Advantages of electrical fuses (efuses) for permanent storage in integrated circuits have been previously described, for example, in U.S. Pat. No. 7,098,721. Electrical fuses do not require special manufacturing equipment, such as laser trimming equipment needed for laser-cut fuses. Electric fuses are permanent under high stress conditions that may cause volatility problems with other permanent storage such as EEPROM. Additionally, electrical fuses do not require specialized fabrication processes.

However, programming and sensing circuits must be advanced to better use electrical fuses. The sense circuit should not alter the programming of the fuse, and the programming of the fuse should be sensed reliably and quickly.

SUMMARY OF THE INVENTION

Embodiments of the invention are directed toward circuits for sensing and programming of electric fuses in integrated circuits.

An exemplary embodiment of the present invention provides an efuse circuit, including: an electrically programmable fuse; a first switch for coupling a first terminal of the fuse to a ground supply; a comparator for sensing a status of the fuse; a second switch for coupling the first terminal of the fuse to a first input terminal of the comparator; and a reference voltage circuit coupled to a second input terminal of the comparator.

The efuse circuit may include a switchable circuit for programming the fuse, the switchable circuit coupled to a second terminal of the fuse.

The switchable circuit may include a current source coupled to the second terminal of the fuse, and a switch for coupling the second terminal of the fuse to the ground supply.

The reference voltage circuit may include: a reference current source coupled to the second input terminal of the comparator; a reference resistor; a first matching switch coupled between the reference current source and a first terminal of the reference resistor; and a second matching switch coupled between a second terminal of the reference resistor and the ground supply.

The efuse circuit may include a second current source coupled to the first input of the comparator.

The reference current source and second current source may be configured to supply currents having substantially the same magnitude.

The efuse circuit may include a current source coupled to the second terminal of the fuse, and a switch for coupling the second terminal of the fuse to the ground supply.

The first switch may include a transistor having a drain terminal coupled to the first terminal of the fuse, a gate terminal coupled to a program select signal, and a source terminal coupled to the ground supply; the second switch may include a transistor having a drain terminal coupled to the second current source, a gate terminal coupled to a sense select signal, and a source terminal coupled to the first terminal of the fuse; the first matching switch may include a transistor having a drain terminal coupled to the reference current source, a gate terminal coupled to a voltage supply, and a source terminal coupled to the first terminal of the reference resistor; the second matching switch may include a transistor having a drain terminal coupled to the second terminal of the reference resistor, a gate terminal coupled to the voltage supply, and a source terminal coupled to the ground supply; and the switch for coupling the second terminal of the fuse to the ground supply may include a transistor having a drain terminal coupled to the second terminal of the fuse, a gate terminal coupled to a programming control signal, and a source terminal coupled to the ground supply.

Another exemplary embodiment of the present invention provides an efuse circuit, including: a plurality of electrically programmable fuses; a plurality of first switches for coupling a first terminal of a corresponding one of the plurality of fuses to a ground supply; a comparator for sensing statuses of the fuses; a plurality second switches for coupling the first terminal of the corresponding one of the plurality of fuses to a first input terminal of the comparator; and a reference voltage circuit coupled to a second input terminal of the comparator.

The efuse circuit may include a switchable circuit for programming the fuse, the switchable circuit including a current source coupled to a second terminal of each of the plurality of fuses, and a switch for coupling the second terminals of the plurality of fuses to the ground supply.

The reference voltage circuit may include: a reference current source coupled to the second input terminal of the comparator; a reference resistor; a first matching switch coupled between the reference current source and a first terminal of the reference resistor; and a second matching switch coupled between a second terminal of the reference resistor and the ground supply.

The efuse circuit may include a second current source coupled to the first input of the comparator.

The first switches may include transistors having drain terminals coupled to the first terminals of the plurality of fuses, gate terminals coupled to program select signals, and source terminals coupled to the ground supply; the second switches may include transistors having drain terminals coupled to the second current source, gate terminals coupled to sense select signals, and source terminals coupled to the first terminals of the plurality of fuses; the first matching switch may include a transistor having a drain terminal coupled to the reference current source, a gate terminal coupled to a voltage supply, and a source terminal coupled to the first terminal of the reference resistor; the second matching switch may include a transistor having a drain terminal coupled to the second terminal of the reference resistor, a gate terminal coupled to the voltage supply, and a source terminal coupled to the ground supply; and the switch for coupling the second terminals of the plurality of fuses to the ground supply may include a transistor having a drain terminal coupled to the second terminals of the plurality of fuses, a gate terminal coupled to a programming control signal, and a source terminal coupled to the ground supply.

BRIEF DESCRIPTION OF THE DRAWINGS

These and other features and aspects according to exemplary embodiments of the present invention will become better understood in reference to the following description, appended claims, and accompanying drawings where:

DETAILED DESCRIPTION

Figure 1:
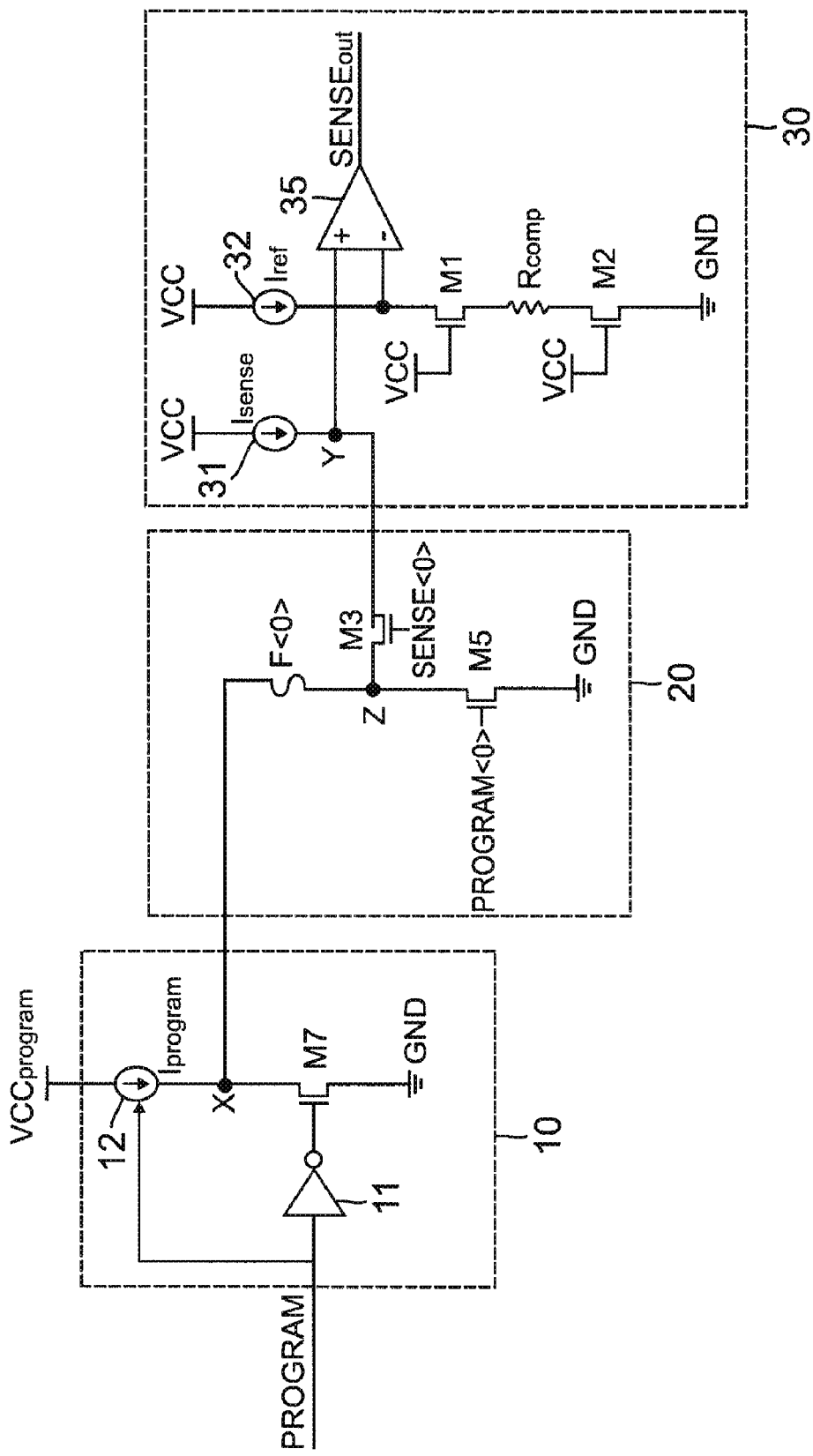
FIG. 1 is a schematic diagram of a single efuse programming and sensing circuit according to an embodiment of the present invention.

FIG. 1 is a schematic diagram of an electrical fuse programming and sensing circuit according to an embodiment of the present invention. The circuit is suitable for embedding in an integrated circuit (IC). The circuit provides an electrical fuse (efuse) $F_{<0>}$, circuitry for programming the state of the efuse, and circuitry for sensing the state of the efuse. The circuit includes three sub-circuits. A first sub-circuit 10 is principally configured for use in programming the efuse F<0>. A second sub-circuit 20 includes the efuse F<0>. A third sub-circuit 30 is configured for sensing the state of the electrical fuse.

The first sub-circuit 10 receives a programming control signal PROGRAM that controls whether the circuit operates to program (or blow) the efuse F<0> or operates to sense the status of the efuse F<0>. When the programming control signal PROGRAM is at a high level, the circuit is configured for programming the efuse F<0>, and when the programming control signal PROGRAM is at a low level, the circuit is configured for sensing the state of the efuse F<0>. The first sub-circuit 10 receives a programming power supply VCCprogram. The programming power supply VCCprogram may supply a voltage greater than the nominal voltage of the IC. For example, in one embodiment, the programming power supply VCCprogram supplies a voltage that is nominally 5 V, whereas the IC (or parts thereof) operates with a nominal supply of 3.3 V. A higher voltage for the programming supply voltage VCCprogram may beneficially aid in routing a sufficiently large current through the efuse F<0> to program it.

The first sub-circuit 10 includes an inverter 11, a first transistor M7, and a first current source 12. The inverter 11 has its input coupled to the programming control signal PROGRAM. The output of the inverter 11 is coupled to a gate terminal of the first transistor M7. A source terminal of the first transistor M7 is coupled a ground supply GND. A drain terminal of the first transistor M7 is coupled to a programming common node X. When the programming control signal PROGRAM is at a high voltage, the output of the inverter 11 is a low voltage and the first transistor M7 is off. This condition is used for programming the efuse F<0> and the first transistor M7 is essentially an open circuit during programming. When the programming control signal PROGRAM is at a low voltage, the output of the inverter 11 is a high voltage and the first transistor M7 is on. This condition is used for sensing the status of the efuse F<0> and the first transistor M7 essentially supplies the ground supply GND to the programming common node X.

The first current source 12 is coupled to the programming supply voltage VCCprogram for a source of electricity. The output of the first current source 12 is coupled to the programming common node X from which it is coupled to the efuse F<0>. The first current source 12 is a switched current source, that is, the current may be switched off or on. The first current source 12 receives the programming control signal PROGRAM to control switching the output current off and on. When the programming control signal PROGRAM is at a high voltage, the first current source 12 supplies a current of magnitude Iprogram to the programming common node X. This condition is used for programming the efuse F<0> and the current is routed through the efuse F<0> if it is to be programmed. Iprogram is designed to be sufficient to program efuse F<0>, for example, 10 mA. When the programming control signal PROGRAM is at a low voltage, the first current source 12 is turned off and does not supply current to the programming common node X. This condition is used for sensing the status of the efuse F<0> and the first current source 12 is essentially not a part of sensing fuse status. The first current source 12 may be implemented, for example, with current mirrors.

Although a specific circuit arrangement is shown in FIG. 1, many variations of the first sub-circuit are within the scope of the invention. For example, an embodiment may invert the polarities of the programming current and make corresponding changes to power supplies and control signals. Additionally, in an embodiment, the first transistor M7 may be replaced with a cascode of transistors to facilitate a programming supply voltage greater than the intended operating voltage of the transistors available on the IC.

The second sub-circuit 20 includes the efuse F<0>, a program select transistor M5, and a sense select transistor M3. The efuse F<0> is made of a small segment of silicided polysilicon, for example, as described in "IBM System z9 eFUSE applications and methodology," R. F. Rizzolo et al., IBM J. Res. & Dev., vol. 51, no. 1/2, January/March 2007, the contents of which are incorporated herein by reference. Alternatively, efuse F<0> may utilize other suitable materials. The efuse F<0> has a relatively small resistance, for example, 200Ω, before programming. After programming, the efuse F<0> has a relatively large resistance, for example, 2000Ω. The efuse F<0> has a first terminal coupled to the programming common node X and a second terminal coupled to an internal node Z.

The program select transistor M5 receives a program select signal PROGRAM<0> at its gate. The program select transistor M5 has a source terminal coupled to the ground supply GND and a drain terminal coupled to the internal node Z. The program select transistor M5 operates in conjunction with the first sub-circuit 10 to program the efuse F<0>. When the program select signal PROGRAM<0> is at a high voltage, the program select transistor M5 is on. This condition is used for programming the efuse F<0> and the program select transistor M5 essentially connects the internal node Z to the ground supply GND. Concurrently, the programming control signal PROGRAM is at a high level. Thus, a current supplied by the first current source 12 passes through the efuse F<0> and through the program select transistor M5 to the ground supply GND. The program select transistor M5 is designed to have a low on resistance so that it can sink the programming current with a small voltage drop that will not interfere with programming the efuse. However, a low on resistance is associated with a large size transistor. Larger size transistors are associated with larger leakage currents that may interfere with circuit operation. Additionally, larger size transistors are associated with larger capacitances that may interfere with sensing the status of the fuse. When the program select signal PROGRAM<0> is at a low voltage, the program select transistor M5 is off. This condition is used for sensing the status of the efuse F<0> and the program select transistor M5 is essentially an open circuit during sensing.

The sense select transistor M3 receives a sense select signal SENSE<0> at its gate. The sense select transistor M3 has a source terminal coupled to the internal node Z and a drain terminal coupled to a sensing common node Y. The sense select transistor M3 operates in conjunction with the first sub-circuit 10 and the third sub-circuit 30 to sense the status of the efuse F<0>. When the sense select signal SENSE<0> is at a low voltage, the sense select transistor M3 is off. This condition is used for programming the status of the efuse F<0> and the sense select transistor M3 is essentially an open circuit during programming. When the sense select signal SENSE<0> is at a high voltage, the sense select transistor M3 is on. This condition is used for sensing the status of the efuse F<0> and the sense select transistor M3 essentially connects the internal node Z to the sensing common node Y. Concurrently, the programming control signal PROGRAM is at a low level. Thus, the programming common node X is coupled to the ground supply GND via the first transistor M7. Since the transistors used to switch programming current and the transistors used to switch sensing current are distinct, they may be separately designed for their intended functions.

Although a specific circuit arrangement is shown in FIG. 1, many variations of the second sub-circuit are within the scope of the invention. FIG. 1 shows n-type MOSFETs but other transistor types may be used. For example, an embodiment may use p-type MOSFETs and invert the polarities of the power supplies and control signals. Additionally, in an embodiment, the program select transistor M5 or the sense select transistor M3 may be replaced with a cascode of transistors to facilitate voltages greater than the intended operating voltage of the transistors available on the IC.

The third sub-circuit 30 includes a sense current source 31, a reference current source 32, a comparator 35, a first matching transistor M1, a second matching transistor M2, and a comparison resistor Rcomp. The comparator 35 has a positive input coupled to the sensing common node Y and a negative input coupled to a comparison (or reference) voltage. The comparator 35 has an output SENSEout that is a high level when the positive input of the comparator is greater than the negative input of the comparator; the comparator output SENSEout is a low level when the positive input of the comparator is less than the negative input of the comparator.

The sense current source 31 supplies a current to the sensing common node Y. The supplied current, of magnitude Isense, is routed to the efuse F<0> during a sensing operation and may be chosen to be sufficiently small to avoid altering the programming of the efuse. The reference current source 32 supplies a current used to create a voltage for comparison during sensing. More specifically, the reference current source 32 is coupled to the negative input of the comparator 35 and supplies a current of magnitude Iref. The first matching transistor M1 has a drain terminal coupled to the reference current source 32, a gate terminal coupled to a positive supply VCC, and a source terminal connected to a first terminal of the comparison resistor Rcomp. The second matching transistor M2 has a drain terminal coupled to a second terminal of the comparison resistor Rcomp, a gate terminal coupled to the positive supply VCC, and a source terminal connected to the ground supply GND. The first and second matching transistors M1, M2 are turned on by the positive supply VCC at their gate terminals.

In one embodiment, the sense current source 31 and the reference current source 32 are constructed with current mirrors and supply currents having the same magnitude, but the invention is not so limited. The first matching transistor M1 is designed to match the sense select transistor M3. That is, the first matching transistor M1 is designed so that during sensing, the voltages between the source and drain terminals of the first matching transistor M1 and the sense select transistor M3 are substantially the same. When the sense current source 31 and the reference current source 32 supply currents of the same magnitude, the matching may be accomplished by making the first matching transistor M1 be a replica of sense select transistor M3. Similarly, the second matching transistor M2 is designed to match the first transistor M7.

To further understand the sensing operation, consider the voltages at the positive and negative inputs to the comparator 35. At the positive input, the voltage is the sum of the voltage drops across the sense select transistor M3, the efuse F<0>, and the first transistor M7. The current through each of these circuit elements is the current of magnitude Isense supplied by the sense current source 31. At the negative input of the comparator 35, the voltage is the sum of the voltage drops across the first matching transistor M1, the comparison resistor Rcomp, and the second matching transistor M2. The current through each of these circuit elements is the current of magnitude Iref supplied by the reference current source 32.

As described above, the voltage drop across the first matching transistor M1 matches the voltage drop across the sense select transistor M3 and the voltage drop across the second matching transistor M2 matches the voltage drop across the transistor M7. Thus, the voltage difference at the input to the comparator 35 is essentially determined by the difference in the voltage drop across the efuse F<0> and the voltage drop across the comparison resistor Rcomp. Small differences in the voltages across the transistors may exist but they are small in comparison. By designing the comparison resistor Rcomp to have a resistance between the intact and programmed resistance of the efuse F<0>, the differential voltage at the input of the comparator 35 will be positive for a programmed efuse and negative for an intact efuse. The comparator 35 may be designed to operate with high resolution ability for the expected common mode inputs, for example, by using p-type input transistors for input voltages near ground level.

In one embodiment, the component values are Rcomp=1 k$\Omega$, Isense=Iref=250 $\mu$A, and Iprogram=15 mA. A programmed efuse results in a comparison voltage of 500 mV or greater. An intact efuse results in a comparison voltage of 50 mV or less.

As with the first and second sub-circuits, many variations of the third sub-circuit are within the scope of the present invention. For example, the first and second matching transistors M1, M2 may be modified to match modifications to the sense select transistor M3 and the first transistor M7. The sense current source 31 and the reference current source 32 may be switched so that their currents are only turned on during sensing operations. Similarly, the comparator 35 may include a clock or enable input. Additionally, the polarities of the signals and supplies may be inverted.

Figure 2:
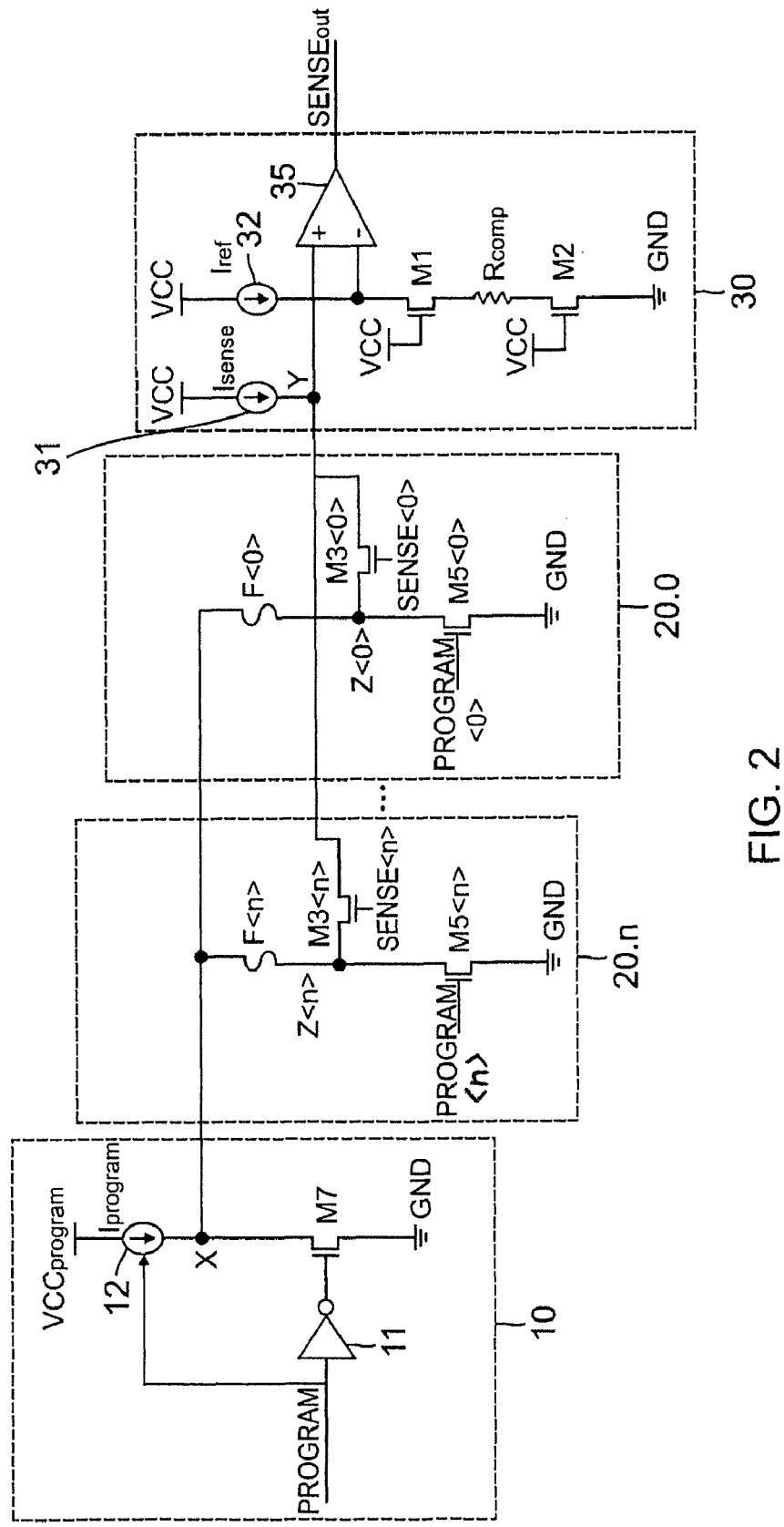
FIG. 2 is a schematic diagram of a multiple efuse programming and sensing circuit according to an embodiment of the present invention.

FIG. 2 is a schematic diagram of an electrical fuse programming and sensing circuit according to an embodiment of the present invention. The circuit is similar to the embodiment of FIG. 1 but differs in that it is adapted for multiple efuses. The circuit includes multiple efuses F<0> . . . F<n>. The circuit includes a first sub-circuit 10 principally configured for use in programming the efuses F<0> . . . F<n>. The circuit includes multiple second sub-circuits 20.0 . . . 20.n, each including an efuse and selection switches. The number of efuses corresponds to the number of bits of status to be stored by the circuit. The circuit also includes a third sub-circuit 30 configured for sensing the state of the fuses.

The first sub-circuit 10 and the third sub-circuit 30 are the same as the first and third sub-circuits, respectively, of the embodiment of FIG. 1. The second sub-circuits 20.0 . . . 20.n correspond to the second sub-circuit of the embodiment of FIG. 1. Each of the second sub-circuits is essentially the same.

The second sub-circuits 20.0 . . . 20.n include the efuses F<0> . . . F<n>, program select transistors M5<0> . . . M5<n>, and sense select transistors M3<0> . . . M3<n>. Each of the efuses F<0> . . . F<n> is made of a small segment of silicided polysilicon as described above regarding the embodiment of FIG. 1. Each efuse F<0> . . . F<n> has a first terminal coupled to a programming common node X and a second terminal coupled to an internal node Z<0> . . . Z<n>. That is, the first terminals of the efuses F<0> . . . F<n> are commonly connected to the programming common node X. However, the second terminals of the efuses F<0>., F<n> are coupled to internal nodes Z<0> . . . Z<n> that are not shared between the second sub-circuits 20.0 . . . 20.n.

Each of the program select transistors M5<0> . . . M5<n> receives a program select signal PROGRAM<0> . . . PROGRAM<n> at its gate. The program select transistors M5<0> . . . M5<n> have source terminals coupled to the ground supply GND and drain terminals coupled to the corresponding internal node Z<0> . . . Z<n>. The program select transistors M5<0> . . . M5<n> operate in conjunction with the first sub-circuit 10 to program the efuses F<0> . . . F<n>. When one of the program select signals PROGRAM<0> . . . PROGRAM<n> is at a high voltage, the corresponding one of the program select transistors M5<0> . . . M5<n> is on. Concurrently, the programming control signal PROGRAM is at a high level. Thus, a current supplied by the first current source 12 passes through a selected one of the efuses F<0> . . . F<n> and through the corresponding one of the program select transistors M5<0> . . . M5<n> to the ground supply GND. When the program select signals PROGRAM<0> . . . PROGRAM<n> are at a low voltage, the program select transistors M5<0> . . . M5<n> are off. This condition is used for sensing the status of the efuses F<0> . . . F<n>.

The sense select transistors M3<0> . . . M3<n> receive sense select signals SENSE<0> . . . SENSE<n> at their gates. The sense select transistors M3<0> . . . M3<n> have source terminals coupled the corresponding one of the internal nodes Z<0> . . . Z<n> and drain terminals coupled to a sensing common node Y. The sense select transistors M3<0> . . . M3<n> operate in conjunction with the first sub-circuit 10 and the third sub-circuit 30 to sense the status of the efuses F<0> . . . F<n>. When one of the sense select signals SENSE<0> . . . SENSE<n> is at a low voltage, the corresponding one of sense select transistors M3<0> . . . M3<n> is off. This condition is used during programming and when sensing the status of another of the efuses F<0> . . . F<n>. When one of the sense select signals SENSE<0> . . . SENSE<n> is at a high voltage, the corresponding one of the sense select transistors M3<0> . . . M3<n> is on. This condition is used for sensing the status of the corresponding one of the efuses F<0> . . . F<n>. Concurrently, the programming control signal PROGRAM is at a low level and the program select signals PROGRAM<0> . . . PROGRAM<N> are at low levels.

To further understand the sensing operation, consider a case where the status of the n-th efuse F<n> is to be sensed. The programming control signal PROGRAM is at a low level, which couples the programming common node X to the ground supply GND via the first transistor M7. All of the program select signals PROGRAM<0> . . . PROGRAM<n> are at low levels, which causes all the program select transistors M5<0> . . . M5<n> to be off. The n-th sense select signal SENSE<n> is at a high level, which turns on the n-th sense select transistor M3<n> and couples the n-th efuse F<n> to the sensing common node Y. The other sense select signals are at low levels, which turn off the other sense select transistors. Since the third sub-circuit 30 sources a current to the sensing common node Y, that current is coupled through the n-th efuse F<n>. The sensing operation then compares the voltage on the sensing common node Y to a comparison voltage as described for the embodiment of FIG. 1. Since only one of the efuses F<0> . . . F<n> is coupled to the comparator at a time, sensing is not slowed by capacitance associated with the other fuses or their surrounding circuitry.

Although a specific circuit arrangement is shown in FIG. 2, many variations are within the scope of the invention. For example, the sub-circuits may be altered as described regarding the embodiment of FIG. 1. Additionally, the efuses F<0> . . . F<n> may be hierarchically organized. Additionally, the efuses F<0> . . . F<n> may be grouped with subsets of the efuses F<0> . . . F<n> coupled to one of several of the first or second sub-circuits.

Although the present invention has been described in certain specific embodiments, many additional modifications and variations would be apparent to those skilled in the art. It is therefore to be understood that this invention may be practiced other than as specifically described. Thus, the present embodiments of the invention should be considered in all respects as illustrative and not restrictive and the scope of the invention determined by the claims supported by this application and their equivalents.

What is claimed is:

1. An efuse circuit, comprising:
an electrically programmable fuse;
a first switch for coupling a first terminal of the fuse to a ground supply;
a comparator for sensing a status of the fuse;
a second switch for coupling the first terminal of the fuse to a first input terminal of the comparator;
a reference voltage circuit coupled to a second input terminal of the comparator, the reference voltage circuit comprising:
  a reference current source coupled to the second input terminal of the comparator;
  a reference resistor;
  a first matching switch coupled between the reference current source and a first terminal of the reference resistor; and
  a second matching switch coupled between a second terminal of the reference resistor and the ground supply;
a second current source coupled to the first input of the comparator, wherein the reference current source and second current source are configured to supply currents having substantially the same magnitude;
a third current source coupled to a second terminal of the fuse; and
a third switch for coupling the second terminal of the fuse to the ground supply.

2. The circuit of claim 1, wherein a switchable circuit, for programming the fuse, comprises the third current source coupled to the second terminal of the fuse, and the third switch for coupling the second terminal of the fuse to the ground supply.

3. The circuit of claim 1, wherein:
the first switch comprises a transistor having a drain terminal coupled to the first terminal of the fuse, a gate terminal coupled to a program select signal, and a source terminal coupled to the ground supply;
the second switch comprises a transistor having a drain terminal coupled to the second current source, a gate terminal coupled to a sense select signal, and a source terminal coupled to the first terminal of the fuse;
the first matching switch comprises a transistor having a drain terminal coupled to the reference current source, a gate terminal coupled to a voltage supply, and a source terminal coupled to the first terminal of the reference resistor;

the second matching switch comprises a transistor having a drain terminal coupled to the second terminal of the reference resistor, a gate terminal coupled to the voltage supply, and a source terminal coupled to the ground supply; and the third switch comprises a transistor having a drain terminal coupled to the second terminal of the fuse, a gate terminal coupled to a programming control signal, and a source terminal coupled to the ground supply.

4. An efuse circuit, comprising:

a plurality of electrically programmable fuses;

a plurality of first switches for coupling a first terminal of a corresponding one of the plurality of fuses to a ground supply;

a comparator for sensing statuses of the fuses;

a plurality second switches for coupling the first terminal of the corresponding one of the plurality of fuses to a first input terminal of the comparator;

a switchable circuit for programming the fuses, the switchable circuit comprising a current source coupled to a second terminal of each of the plurality of fuses, and a third switch for coupling the second terminals of the plurality of fuses to the ground supply;

a reference voltage circuit coupled to a second input terminal of the comparator, the reference voltage circuit comprising:
  a reference current source coupled to the second input terminal of the comparator;
  a reference resistor;
  a first matching switch coupled between the reference current source and a first terminal of the reference resistor; and
  a second matching switch coupled between a second terminal of the reference resistor and the ground supply;

a second current source coupled to the first input of the comparator;

wherein the first switches comprise transistors having drain terminals coupled to the first terminals of the plurality of fuses, gate terminals coupled to program select signals, and source terminals coupled to the ground supply;

wherein the second switches comprise transistors having drain terminals coupled to the second current source, gate terminals coupled to sense select signals, and source terminals coupled to the first terminals of the plurality of fuses;

wherein the first matching switch comprises a transistor having a drain terminal coupled to the reference current source, a gate terminal coupled to a voltage supply, and a source terminal coupled to the first terminal of the reference resistor;

wherein the second matching switch comprises a transistor having a drain terminal coupled to the second terminal of the reference resistor, a gate terminal coupled to the voltage supply, and a source terminal coupled to the ground supply; and wherein the third switch comprises a transistor having a drain terminal coupled to the second terminals of the plurality of fuses, a gate terminal coupled to a programming control signal, and a source terminal coupled to the ground supply.

5. An efuse circuit, comprising:

a plurality of electrically programmable fuses;

a plurality of first switches for coupling a first terminal of a corresponding one of the plurality of fuses to a ground supply;

a comparator for sensing statuses of the fuses;

a plurality second switches for coupling the first terminal of the corresponding one of the plurality of fuses to a first input terminal of the comparator; and a reference voltage circuit coupled to a second input terminal of the comparator, the reference voltage circuit comprising:
  a reference current source coupled to the second input terminal of the comparator;
  a reference resistor;
  a first matching switch coupled between the reference current source and a first terminal of the reference resistor;
  a second matching switch coupled between a second terminal of the reference resistor and the ground supply; and
  a second current source coupled to the first input of the comparator, wherein the reference current source and second current source are configured to supply currents having substantially the same magnitude;

a third current source coupled to a second terminal of the corresponding one of the plurality of fuses; and a third switch for coupling the second terminal of the corresponding one of the plurality of fuses to the ground supply.

6. The circuit of claim 5, wherein:

the first switches comprise transistors having drain terminals coupled to the first terminals of the plurality of fuses, gate terminals coupled to program select signals, and source terminals coupled to the ground supply;

the second switches comprise transistors having drain terminals coupled to the second current source, gate terminals coupled to sense select signals, and source terminals coupled to the first terminals of the plurality of fuses;

the first matching switch comprises a transistor having a drain terminal coupled to the reference current source, a gate terminal coupled to a voltage supply, and a source terminal coupled to the first terminal of the reference resistor;

the second matching switch comprises a transistor having a drain terminal coupled to the second terminal of the reference resistor, a gate terminal coupled to the voltage supply, and a source terminal coupled to the ground supply; and the third switch comprises a transistor having a drain terminal coupled to the second terminals of the plurality of fuses, a gate terminal coupled to a programming control signal, and a source terminal coupled to the ground supply.

* * * * *

UNITED STATES PATENT AND TRADEMARK OFFICE
CERTIFICATE OF CORRECTION

PATENT NO. : 7,902,903 B2
APPLICATION NO. : 12/502938
DATED : March 8, 2011
INVENTOR(S) : Rosik et al.

It is certified that error appears in the above-identified patent and that said Letters Patent is hereby corrected as shown below:

In the Claims

Column 9, Claim 4, line 19          After "plurality" Insert -- of --

Column 10, Claim 5, line 12         After "plurality" Insert -- of --

Signed and Sealed this
Twenty-seventh Day of September, 2011

David J. Kappos
*Director of the United States Patent and Trademark Office*